US012609703B2

(12) United States Patent
Link et al.

(10) Patent No.: US 12,609,703 B2
(45) Date of Patent: Apr. 21, 2026

(54) INPUT SIGNAL SHAPING FOR A PROGRAMMABLE LOGIC ARRAY

(71) Applicant: STMICROELECTRONICS (ROUSSET) SAS, Rousset (FR)

(72) Inventors: Jean-Francois Link, Trets (FR); Mark Wallis, Mouans Sartoux (FR); Joran Pantel, Marseilles (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 202 days.

(21) Appl. No.: 18/641,199

(22) Filed: Apr. 19, 2024

(65) Prior Publication Data

US 2024/0267050 A1     Aug. 8, 2024

Related U.S. Application Data

(63) Continuation of application No. 17/733,934, filed on Apr. 29, 2022, now Pat. No. 11,979,153.

(51) Int. Cl.
H03K 19/17736     (2020.01)
H03K 19/173     (2006.01)

(52) U.S. Cl.
CPC ... H03K 19/17744 (2013.01); H03K 19/1737 (2013.01); H03K 19/1774 (2013.01)

(58) Field of Classification Search
None
See application file for complete search history.

(56) References Cited

U.S. PATENT DOCUMENTS

| | | | |
|---|---|---|---|
| 5,046,035 A | 9/1991 | Jigour et al. | |
| 5,144,166 A | 9/1992 | Camarota et al. | |
| 5,231,636 A | 7/1993 | Rasmussen | |
| 5,550,499 A | 8/1996 | Eitrheim | |
| 5,614,844 A | 3/1997 | Sasaki et al. | |
| 5,835,998 A | 11/1998 | Pedersen | |
| 5,905,385 A | 5/1999 | Sharpe-Geisler | |
| 6,011,407 A | 1/2000 | New | |
| 6,057,708 A | 5/2000 | New | |
| 6,084,447 A | 7/2000 | Graf, III | |

(Continued)

FOREIGN PATENT DOCUMENTS

| | | |
|---|---|---|
| CN | 102148920 A | 8/2011 |
| CN | 103142245 A | 6/2013 |

(Continued)

OTHER PUBLICATIONS

Bieniosek et al., "Analog Filtering Methods Improve Leading Edge Timing Performance of Multiplexed SiPMs", IEEE, 2015, 3 pages.

(Continued)

*Primary Examiner* — Jany Richardson
(74) *Attorney, Agent, or Firm* — Seed Intellectual Property Law Group LLP

(57)     ABSTRACT

A system on chip includes a programmable logic array. The system on chip also includes a signal conditioner coupled to a data input of the programmable logic array and configured to condition a data signal prior to processing the data signal with the programmable logic array. The signal conditioner can selectively condition the signal by one or both of synchronizing the data signal with a clock signal of the programmable logic array and generating a pulse from the data signal with an edge detector.

20 Claims, 3 Drawing Sheets

(56) References Cited

U.S. PATENT DOCUMENTS

| | | | |
|---|---|---|---|
| 6,184,707 B1 | 2/2001 | Norman et al. | |
| 6,329,839 B1 | 12/2001 | Pani et al. | |
| 6,614,314 B2 | 9/2003 | d'Haene et al. | |
| 6,651,231 B2 | 11/2003 | Morikawa | |
| 6,686,769 B1 | 2/2004 | Nguyen et al. | |
| 6,741,644 B1 | 5/2004 | Dehghan et al. | |
| 6,748,577 B2 | 6/2004 | Bal | |
| 7,003,423 B1 | 2/2006 | Kabani et al. | |
| 7,218,133 B2 | 5/2007 | Lewis et al. | |
| 8,135,884 B1 | 3/2012 | Sullam et al. | |
| 8,334,712 B2 | 12/2012 | Klein et al. | |
| 8,664,975 B1 | 3/2014 | Gao et al. | |
| 8,675,681 B2 | 3/2014 | Hill et al. | |
| 8,838,852 B1 * | 9/2014 | Sullam | G06F 13/24 |
| | | | 710/48 |
| 8,913,601 B1 | 12/2014 | Kaviani | |
| 8,977,882 B2 | 3/2015 | Garg et al. | |
| 9,106,235 B2 | 8/2015 | Dally | |
| 9,577,648 B2 | 2/2017 | Shivaram et al. | |
| 9,690,278 B1 | 6/2017 | Chen et al. | |
| 9,787,311 B1 | 10/2017 | Ooi | |
| 10,284,185 B1 | 5/2019 | Gaide et al. | |
| 10,587,271 B2 | 3/2020 | Wang et al. | |

| | | | |
|---|---|---|---|
| 2002/0087606 A1 | 7/2002 | Harness et al. | |
| 2004/0257471 A1 | 12/2004 | Kim | |
| 2008/0028187 A1 | 1/2008 | Casselman et al. | |
| 2013/0093461 A1 | 4/2013 | Voogel et al. | |
| 2016/0182054 A1 | 6/2016 | Westwick et al. | |
| 2016/0261272 A1 | 9/2016 | Ikeda et al. | |
| 2017/0215745 A1 * | 8/2017 | Felix | A61B 5/7225 |
| 2017/0262567 A1 | 9/2017 | Vassiliev | |
| 2019/0379380 A1 | 12/2019 | Atsatt | |
| 2020/0256710 A1 | 8/2020 | Rule et al. | |
| 2020/0344180 A1 | 10/2020 | Pope et al. | |
| 2023/0387917 A1 | 11/2023 | Link et al. | |
| 2024/0014819 A1 | 1/2024 | Wallis et al. | |
| 2024/0178842 A1 | 5/2024 | Wallis et al. | |

FOREIGN PATENT DOCUMENTS

| | | |
|---|---|---|
| JP | H0637931 A | 2/1994 |
| JP | 2005012803 A | 1/2005 |

OTHER PUBLICATIONS

Zhang et al., "Research on body pulse information extraction based on PPG", Electronic Measurement Technology, 2019, pp. 117-120.

* cited by examiner

INPUT SIGNAL SHAPING FOR A PROGRAMMABLE LOGIC ARRAY

TECHNICAL FIELD

The present disclosure is related to integrated circuits, and more particularly, to integrated circuits including programmable logic arrays (PLA).

DESCRIPTION OF THE RELATED ART

Many integrated circuits include a programmable logic array (PLA). The PLA may include a plurality of logic elements. A user of the integrated circuit can program the connections between the logical elements and between inputs and outputs of the PLA in order to achieve a desired result. A logic element can be programmed to combine one or more of its inputs to generate a single output, whose state is a Boolean function of the input states. The output state may or may not be captured by a flip-flop or latch.

However, before the PLA can function in the desired manner, it is beneficial to condition the input signals received by the PLA in a manner that enables the PLA to function properly. In some cases, the PLA can receive inputs from an I/O pad of the integrated circuit. In other cases, the PLA can receive inputs from other parts of the integrated circuit.

The characteristics of these input signals may not initially be known by the PLA and can depend on the number of parameters. Some of these parameters can include the source clocks generating the input signal and the routing both inside and outside of the integrated circuit. Passing the input signals to the PLA without any precautions may result in faulty behaviour. For example, glitches may occur within the PLA resulting in errors in the output signals of the PLA. Additionally, asynchronous signals using combination logic may be entirely unpredictable.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventor's approach to the particular problem, which, in and of itself, may also be inventive.

BRIEF SUMMARY

Embodiments of the present disclosure provide an integrated circuit that enables customizable conditioning of input signals in a PLA of the integrated circuit. More particularly, the integrated circuit includes a signal conditioner coupled to an input of the PLA. The signal conditioner includes an edge detector. When an input signal is received, the signal conditioner passes the input signal to the edge detector. The edge detector produces a pulse signal having a known shape responsive to detecting an edge of the input signal. This pulse is provided as the input to the PLA.

In one embodiment, the signal conditioner is customizable. The signal conditioner can include a first multiplexer. A first input of the multiplexer is coupled to the output of the edge detector. A second input of the multiplexer receives the same input signal as does the edge detector. A user of the PLA can selectively utilize or bypass the edge detector.

In one embodiment, the signal conditioner includes a second multiplexer having an output coupled to the input of the edge detector and the second input of the first multiplexer. The signal conditioner also includes one or both of a synchronizer and a filter coupled between an input of the signal conditioner and the first input of the second multiplexer. A second input of the second multiplexer is coupled to the input of the signal conditioner. The first and second multiplexers can be operated to bypass either or both of the edge detector and the synchronizer and filter. This enables users to have a large amount of control over shaping the inputs of the PLA.

In one embodiment, an integrated circuit includes a programmable logic array having a data input. The integrated circuit includes a signal conditioner. The signal conditioner includes an input, an edge detector, and a first multiplexer having a first input coupled to an output of the edge detector and an output coupled to the data input of the programmable logic array.

In one embodiment, a system on chip or "SOC" includes a signal conditioner having a synchronizer having an input coupled to the input terminal and a first multiplexer having a first input coupled to the input terminal and a second input coupled to an output of the synchronizer. The signal conditioner includes an edge detector having an input coupled to an output of the first multiplexer and a second multiplexer having a first input coupled to the output of the first multiplexer and a second input coupled to an output of the edge detector.

In one embodiment, a method includes receiving a signal at an input of an edge detector and at a first input of a first multiplexer and generating, with the edge detector, a pulse responsive to detecting an edge of the signal. The method includes outputting the pulse to a second input of the first multiplexer and outputting either the signal or the pulse from the first multiplexer to a data input of a programmable logic array.

BRIEF DESCRIPTION OF THE SEVERAL VIEWS OF THE DRAWINGS

Reference will now be made by way of example only to the accompanying drawings. In the drawings, identical reference numbers identify similar elements or acts. In some drawings, however, different reference numbers may be used to indicate the same or similar elements. The sizes and relative positions of elements in the drawings are not necessarily drawn to scale. For example, the shapes of various elements and angles are not necessarily drawn to scale, and some of these elements may be enlarged and positioned to improve drawing legibility.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known systems, components, and circuitry associated with integrated circuits have not been shown or described in detail, to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

Figure 1:
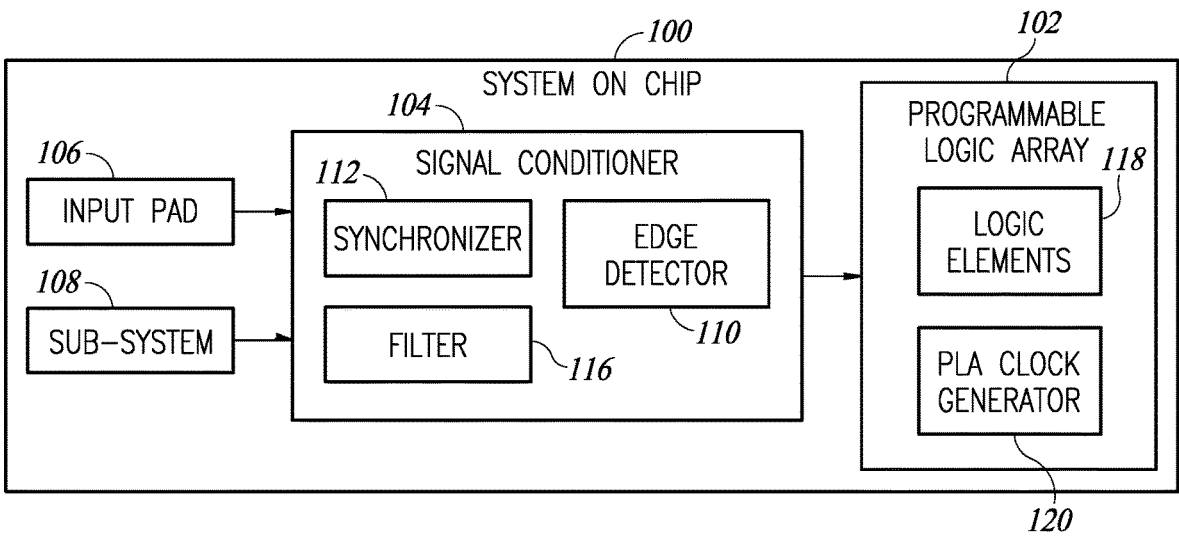
FIG. 1 is a block diagram of an SOC including a PLA and the signal conditioner, according to one embodiment.

FIG. 1 is a block diagram of an integrated circuit 100, according to one embodiment. The integrated circuit 100 includes a PLA 102 and a signal conditioner 104. As will be set forth in more detail below, the signal conditioner 104 enables a user to selectively condition input signals for the PLA 102.

The PLA 102 includes a plurality of programmable logic elements 118. Each logic element may include a plurality of inputs and a plurality of outputs. The logic elements 118 are connected to each other in a programmable way. In other words, a user can select how the logic elements are connected to each other. Furthermore, the user can select the inputs that a logic element 118 receives, and, thus, what the output of logic elements will be based on the inputs received by the PLA 102. In this way, the PLA is "programmable" by the user of the integrated circuit 100.

Each logic element 118 may include one or more multiplexers and a register. The contents of the register are programmable by the user. The multiplexer selects which bit of the register contents is passed to the logic element output, according to the state of the selected inputs. The output of the register can correspond to the outputs of the logic elements. Each logic element 118 may include direct outputs and registered outputs. The direct outputs are output to other logic elements within the array without intervening synchronization, or to the outputs of the PLA 102. The synchronous outputs pass their values through a flip-flop that is controlled by a clock signal. There are various other types of PLAs. These other types of PLAs can be utilized without departing from the scope of the present disclosure.

The PLA 102 includes a PLA clock generator 120. The PLA clock generator 120 generates a PLA clock signal for the PLA 102. The PLA clock signal is the clock signal that controls the function of the logic elements 118. The PLA clock signal can also control other aspects of the PLA 102.

Alternatively, the PLA clock generator 120 can be external to the PLA 102. In this case, the PLA clock generator 120 can provide the PLA clock signal to the PLA 102. In some embodiments, the clock generator 120 may be part of the signal conditioner 104.

The integrated circuit 100 may include one or more input pads 106. The input pads receive data or other signals from circuits external to the integrated circuit 100. The signals or data may have characteristics that are unknown to the integrated circuit. For example, data signals may be passed to the input pads 106 in conjunction with clocks having frequencies and phases that are not known ahead of time to the integrated circuit 100. Some of these data may be passed to the programmable logic array 102. If the input data signals are not conditioned in some way, it may be difficult for the programmable logic array 102 to process the data and generate outputs that are error-free.

The integrated circuit 100 may include one or more subsystems 108. The subsystems 108 are circuits or systems within the integrated circuit 100. In an example in which the integrated circuit 100 is a system on-chip, the integrated circuit 100 may include subsystems such as memory arrays, analog-to-digital converters, digital to analog converters, signal processors, or other types of systems. Some of these subsystems 108 may provide data to the PLA 102. These subsystems 108 may pass data to the PLA 102 in conjunction with clock signals that have frequencies or phases that are unknown to the PLA 102. Furthermore, the shape of the data pulses received from the subsystems 108 may be unknown. If the input data signals from the subsystems 108 are not conditioned in some way, the programmable logic array 102 may not properly process the input data signals and, thus, may generate faulty or erroneous output data.

The integrated circuit includes the signal conditioner 104. The signal conditioner 104 offers a high degree of flexibility to programmers of the PLA 102 and conditioning the signals provided to the PLA 102. While the signal conditioner 104 is illustrated as being separate from the PLA 102, in some cases, the signal conditioner 104 may be part of the PLA 102. In particular, the signal conditioner 104 may be an input circuit of the PLA 102 that receives data signals and passes the data signals to the logic elements 118.

The signal conditioner 104 includes an edge detector 110, a synchronizer 112, and a filter 116. Though not shown in FIG. 1, the PLA clock generator 120 may pass the PLA clock signal to the signal conditioner 104. The signal conditioner 14 can use the PLA clock for various functions, as will be set forth in more detail below.

The signal conditioner includes an edge detector 110. The edge detector 110 receives a data input signal. The data input signal may be provided by either the input pad 106 of the subsystem 108. The data input signal initially may have an unknown shape and frequency. In order to effectively provide the data input signal to the PLA 102 in a manner that can be reliably passed to the various inputs of the logic elements 118, the edge detector 110 detects an edge of the data input signal and outputs a signal to the PLA responsive to detecting an edge of the data input signal.

In one embodiment, the edge detector 110 receives the PLA clock signal on a clock input terminal of the edge detector 110. When the edge detector 110 detects an edge of the data input signal, the edge detector outputs a pulse having a duration the length of the period of a cycle of the PLA clock signal. This can be highly beneficial to the PLA. Signals with unknown shapes or brief pulses can be changed to a pulse that can reliably be received and processed by the logic elements 118 of the PLA 102.

The edge detector 110 may be programmable so that a user of the PLA can select the pulse length output by the edge detector 110. There are various ways that the edge detector 110 can output a pulse without departing from the scope of the present disclosure.

The edge detector 110 may be configured to detect either the rising edge, the falling edge, or both the rising and falling edges. Detecting the rising edge may be particularly beneficial when the data input signal is expected to be low for relatively long periods of time. If a small pulse occurs in the data input signal, the edge detector will detect the rising edge and output a long pulse to the PLA 102. In this way, narrow pulses in the normally low data input signal can be reliably detected and passed on to the PLA 102.

Detecting the falling edge may be particularly beneficial when the data input signal is expected to be high for relatively long periods of time. If the data input signal goes low for a short amount of time, the edge detector 110 will detect the falling edge and output a long pulse to the PLA 102. In this way, narrow drops in the normally high data input signal can be reliably detected and passed on to the PLA 102.

In some cases, it may be beneficial to detect both the rising edge and the falling edge of the data input signal. In these cases, the PLA 102 can be programmed to output a pulse if any change in the data input signal occurs.

The signal conditioner 104 includes a synchronizer 112. The synchronizer 112 may receive the PLA clock signal on a clock input terminal of the synchronizer 112. When the synchronizer 112 receives a transition in the data input signal, the synchronizer 112 will synchronize the transition with the PLA clock signal. This results in the synchronizer 112 passing the transition the data input signal upon the rising edge of the PLA clock signal. This can be useful in synchronizing data input signals with the PLA clock signal so that the programmable logic array 102 can effectively utilize the input signals.

The signal conditioner 104 includes a filter 116. The filter 116 can include a digital filter. The digital filter can be programmable by the user of the PLA 102. The filter 116 can be programmed to filter out undesirable features in the data input signal. For example, in some cases it may be desirable to filter out signal features that have a duration less than a threshold. In other cases it may be desirable to filter out signal features that have a duration that is greater than the threshold. The filter 116 can be selectively programmed so that certain types of features in the data input signal will not be passed on.

In one embodiment, the edge detector 110, the synchronizer 112, and the filter 116 may each be selectively activated. In some situations it may be desirable to utilize the filter 116, the synchronizer 112, and the edge detector 110. In some situations it may be desirable to utilize only two of the edge detector 110, the synchronizer 112, and the filter 116. In some situations it may be desirable to utilize only one of the edge detector 110, the synchronizer 112, and the filter 116. In some situations it may be desirable to not use the edge detector 110, the synchronizer 112, and the filter 116. The signal conditioner 104 enables a user great flexibility in conditioning the data input signals.

Figure 2A:
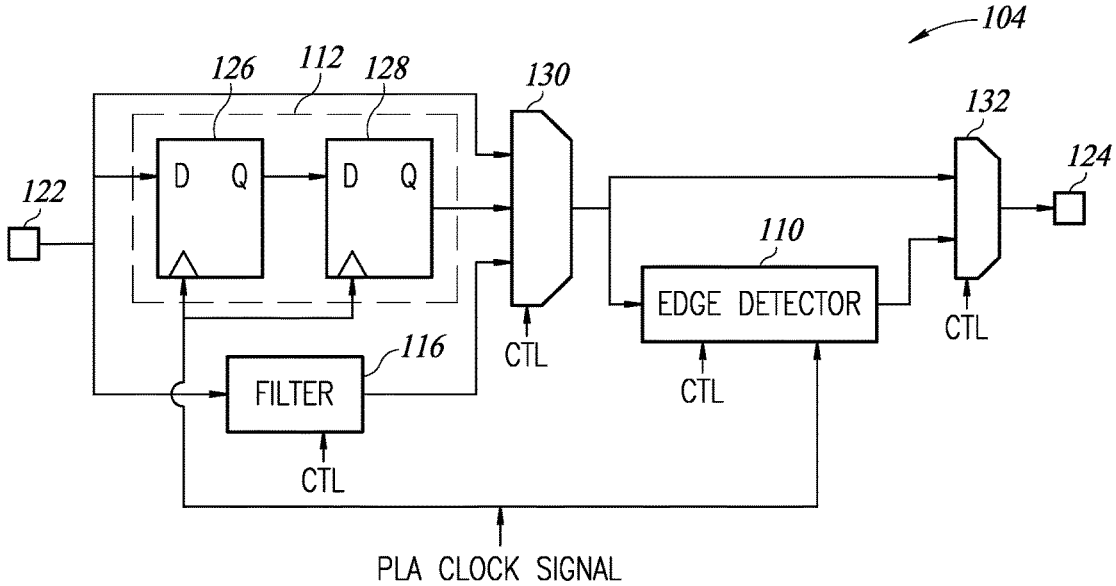
FIG. 2A is a schematic diagram of a signal conditioner for PLA, according to one embodiment.

FIG. 2A is a schematic diagram of a signal conditioner 104, in accordance with some embodiments. The signal conditioner 104 includes an input terminal 122. The input terminal 122 may receive data from an input pad 106 or subsystem 108, as described in relation to FIG. 1.

The signal conditioner 104 includes a synchronizer 112. The synchronizer 112 includes a first flip-flop 126 and the second flip-flop 128. The first flip-flop 126 includes a data input terminal coupled to the input terminal 122. The second flip-flop 128 includes a data input terminal coupled to the data output terminal of the first flip-flop 126. Both the first flip-flop 126 and the second flip-flop 128 receive the PLA clock signal on their data input terminals.

In one embodiment, when a transition in the data input signal at the input terminal 122 has a transition, the transition is passed to the output terminal of the first flip-flop 126 when the PLA clock signal goes high. The transition is then passed to the data input terminal of the second flip-flop 128. The transition will be passed to the data output terminal of the second flip-flop 128 on the next rising edge of the PLA clock signal. This has the effect of synchronizing transitions in the data input signal with the PLA clock signal.

The signal conditioner 104 includes a digital filter 116. The digital filter 116 is programmable by the programmer of the PLA 102. The digital filter 116 can be programmed to filter out signal features that are shorter than a threshold duration, to filter out signal features that are longer than a threshold duration, or to filter out signal features that are shorter than a first threshold duration and signals that are longer than the second threshold duration.

In FIG. 2A, the filter 116 has an input coupled to input terminal 122. Accordingly, the data input signal is received by the filter 116. The filter 116 then filters the data input signal as described previously.

The filter 116 also receives a control signal CTL. The control signal CTL determines the characteristics of the filter 116. The control signal CTL can be programmed by the programmer of the PLA 102. Accordingly, the control signal can determine the filtering characteristics of the filter 116. The filter 116 may also utilize a synchronizer at its input, or may instead receive the output of the synchronizer 112. The filter 116 may also receive a clock input. In the case of an analog filter, a clock signal may not be utilized. In the case of an analog filter, the output of filter 116 may be passed through a synchronizer.

The signal conditioner includes a multiplexer 130. The multiplexer 130 has three inputs. A first input is coupled directly to the input terminal 122. A second input of the multiplexer 130 is coupled to the output of the synchronizer 112. A third input of the multiplexer 130 is coupled to the output of the filter 116. Accordingly, the multiplexer 130 receives the data input signal directly from the input terminal 122 on a first input. The multiplexer 130 receives the data input signal on a second input after being synchronized by the synchronizer 112. The multiplexer 130 receives the data input signal from the filter 116 on the third input. The multiplexer also receives a control signal CTL that determines which of the inputs of the multiplexer will be passed to the output of the multiplexer 130. The control signal CTL can be programmed by the programmer of the PLA.

The signal conditioner 104 includes an edge detector 110. The input of the edge detector 110 is coupled to the output of the multiplexer 130. The edge detector 110 also receives the PLA clock signal on a clock input terminal. The edge detector 110 outputs a pulse upon detecting a selected edge of the data input signal provided from the multiplexer 130. The edge detector 110 can also receive a control signal. The control signal 110 can determine which edge will be detected by the edge detector 110 and the characteristics of the pulse that will be output by the edge detector 110.

The signal conditioner 104 includes a multiplexer 132. The multiplexer 132 has a first input coupled directly to the output of the multiplexer 130. The multiplexer 132 has a second input coupled directly to the output of the edge detector 110. The multiplexer 132 receives a control signal that determines which input will be provided to the output. The output of the multiplexer 132 is coupled to an output terminal 124 of the signal conditioner.

The multiplexers 130 and 132 enable great flexibility in the signal conditioner 104. Depending on the control signals provided to the multiplexers 130 and 132, the data input signal can be passed through the synchronizer 112 and then directly to the output terminal 124 or through the edge detector 110 and then on to the output terminal 124. Depending on the control signals provided to the multiplexers 130 and 132, the data input signal can be passed through the filter 116 and then directly to the output terminal 124 or through the edge detector 110 and then on to the output terminal 124. Depending on the control signals provided to the multiplexers 130 and 132, the data input signal can be passed directly from the input terminal 122 through the edge detector 110 and on to the output terminal 124. Depending on the control signals provided to the multiplexers 131 32, the data input signal can be passed directly from the input terminal 122 to the output terminal 124. Accordingly, the signal conditioner 104 offers greater flexibility to the programmer of the PLA 102.

Figures 2B, 3:
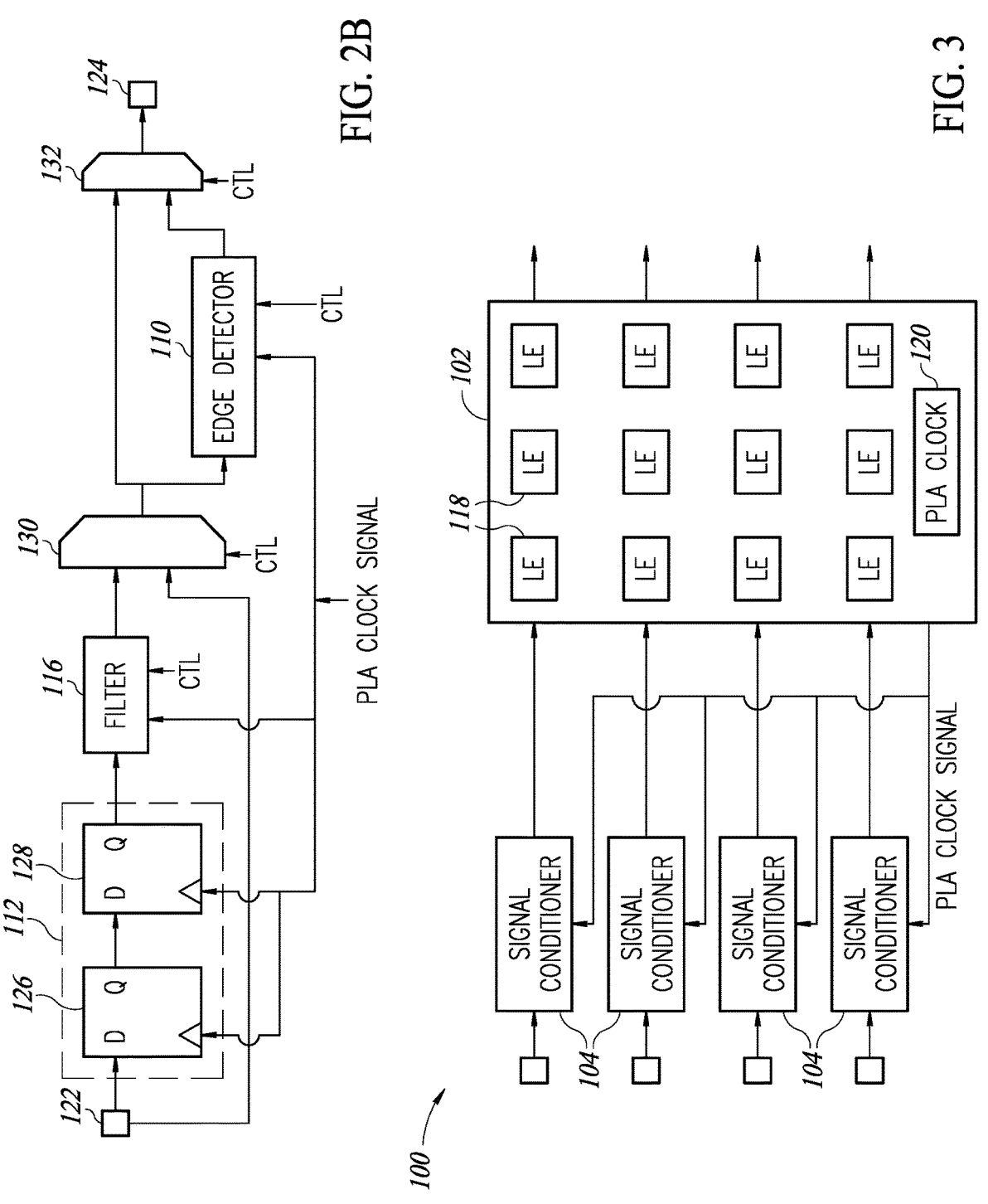
FIG. 2B is a schematic diagram of a signal conditioner for PLA, according to one embodiment.
FIG. 3 is a block diagram of an integrated circuit including a plurality of signal conditioners and the PLA, according to one embodiment.

FIG. 2B is a schematic diagram of a signal conditioner 104, according to one embodiment. The signal conditioner 104 of FIG. 2A is substantially similar to the signal conditioner 104 of FIG. 2B, except that the filter 116 is placed in series with the synchronizer 112. Accordingly, in FIG. 2B, the filter 116 has an input coupled to the output of the second flip-flop 128. Accordingly, the data input signal is passed from the synchronizer 112 to the input of the filter 116. The filter 116 then filters the data input signal as described previously. In one embodiment, the filter 116 can be positioned between the input terminal 122 and the synchronizer 112. Various configurations of a signal conditioner 104 can be utilized without departing from the scope of the present disclosure.

FIG. 3 is a block diagram of an integrated circuit 100, in accordance with some embodiments. The integrated circuit 100 includes a PLA 102 including an array of logic elements (LE) arranged in rows and columns. The PLA 102 includes a plurality of inputs. The integrated circuit 100 includes a plurality of signal conditioners 104. Each signal conditioner 104 is coupled to an input of the PLA 102. Although not shown in FIG. 3, there may also be other inputs to the PLA 102 that do not have a signal conditioner 104. Each signal conditioner 104 can be as described in FIGS. 1-2B.

Figure 4:
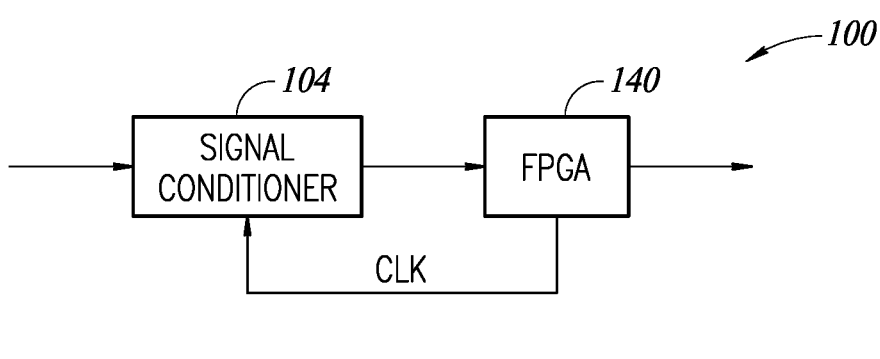
FIG. 4 is a block diagram of an integrated circuit including a field programmable gate array (FPGA) and the signal conditioner, according to one embodiment.

FIG. 4 is a block diagram of an integrated circuit 100, in accordance with some embodiments. The integrated circuit 100 of FIG. 4 includes a signal conditioner 104 at the input of the field programmable gate array (FPGA) 140. The signal conditioner 104 can operate substantially as described in relation to FIGS. 1-2B. The FPGA 140 is programmable by a user of the integrated circuit 100. The FPGA 140 may include a large number of logic gates in complex arrangements. The FPGA 140 receives input data and generates output data in accordance with the programmed configuration of the FPGA 140. The FPGA 140 may generate a clock signal CLK and may provide the clock signal CLK to the signal conditioner 104. The clock signal CLK may be utilized by the signal conditioner 104 substantially similarly to the way the PLA clock signal is used by the signal conditioner in FIGS. 1-3.

Figure 5:
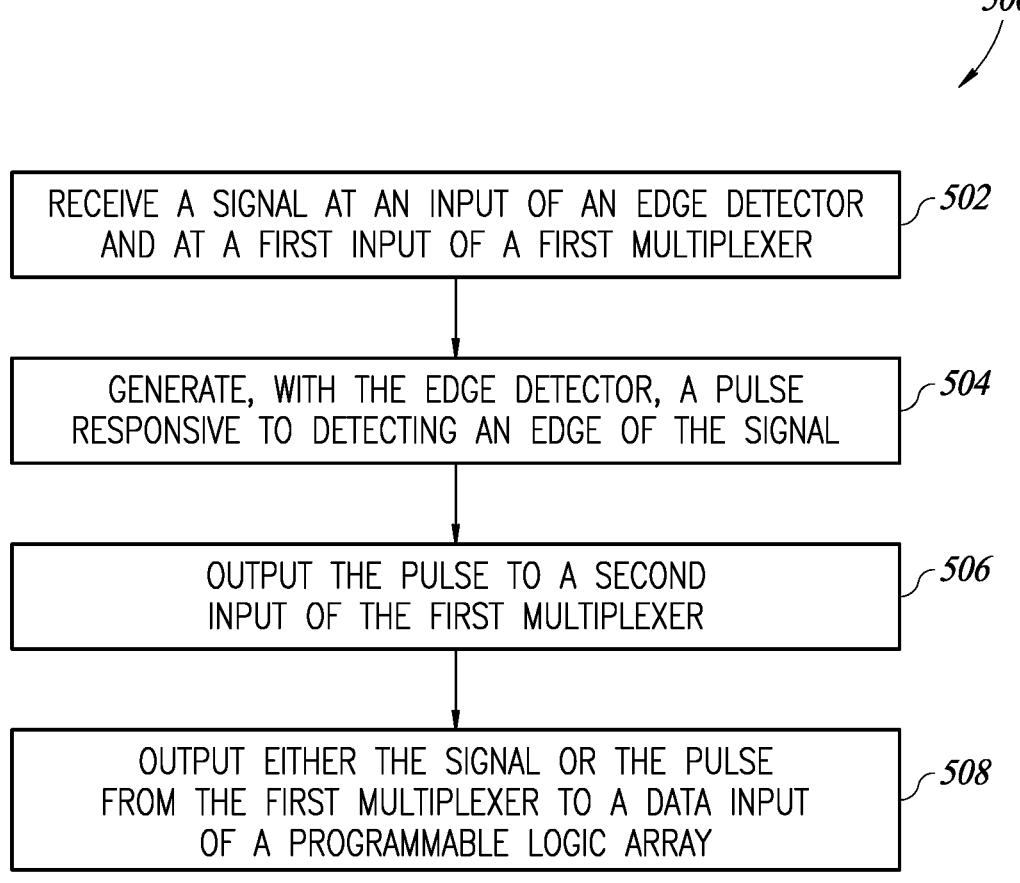
FIG. 5 is a flow diagram of a method for operating an integrated circuit, according to one embodiment.

FIG. 5 is a flow diagram of a method 500, according to some embodiments. The method 500 can utilize components, systems, and processes described in relation to FIGS. 1-4. At 502, the method 500 includes receiving a signal at an input of an edge detector and at a first input of a first multiplexer. At 504, the method 500 includes generating, with the edge detector, a pulse responsive to detecting an edge of the signal. At 506, the method 500 includes outputting the pulse to a second input of the first multiplexer. At 508, the method 500 includes outputting either the signal or the pulse from the first multiplexer to a data input of a programmable logic array.

In one embodiment, an integrated circuit includes a programmable logic array having a data input. The integrated circuit includes a signal conditioner. The signal conditioner includes an input, an edge detector, and a first multiplexer having a first input coupled to an output of the edge detector and an output coupled to the data input of the programmable logic array.

In one embodiment, an SoC includes a signal conditioner having a synchronizer having an input coupled to the input terminal and a first multiplexer having a first input coupled to the input terminal and a second input coupled to an output of the synchronizer. The signal conditioner includes an edge detector having an input coupled to an output of the first multiplexer and a second multiplexer having a first input coupled to the output of the first multiplexer and a second input coupled to an output of the edge detector.

In one embodiment, a method includes receiving a signal at an input of an edge detector and at a first input of a first multiplexer and generating, with the edge detector, a pulse responsive to detecting an edge of the signal. The method includes outputting the pulse to a second input of the first multiplexer and outputting either the signal or the pulse from the first multiplexer to a data input of a programmable logic array.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
receiving, a control signal at a signal conditioner coupled to a programmable logic array, the signal conditioner including a filter, a first multiplexer downstream from the filter, and an edge detector downstream from the first multiplexer;
configuring, the filter, the edge detector, and the first multiplexer based on the control signal;
receiving an input signal at an input of the signal conditioner;
generating a conditioned signal by conditioning the input signal with the signal conditioner configured in accordance with the control signal; and
outputting the conditioned signal to the programmable logic array.

2. The method of claim 1, wherein the signal conditioner includes a second multiplexer having a first input coupled to an output of the edge detector and an output coupled to a data input of the programmable lock array.

3. The method of claim 2, wherein the first multiplexer includes an output coupled to an input of the edge detector and a second input of the second multiplexer.

4. The method of claim 3, wherein the signal conditioner includes a synchronizer coupled between the input of the signal conditioner and a first input of the first multiplexer.

5. The method of claim 4, wherein the first multiplexer includes a second input coupled to the input of the signal conditioner.

6. The method of claim 4, wherein the signal conditioner includes a filter coupled between the synchronizer and the first input of the second multiplexer.

7. The method of claim 5, wherein configuring the signal conditioner includes configuring the filter to filter out signals having feature lengths shorter than a threshold.

8. The method of claim 3, comprising generating a clock signal for the programmable logic array.

9. The method of claim 8, comprising receiving the clock signal with a clock input of the edge detector.

10. The method of claim 9, wherein configuring the signal conditioner includes configuring the edge detector to output a pulse having a duration equal to a period of the clock signal responsive to detecting a signal edge at the output of the second multiplexer.

11. The method of claim 10, wherein configuring the signal conditioner includes configuring the edge detector to detect a rising edge as the signal edge.

12. The method of claim 10, wherein configuring the signal conditioner includes configuring the edge detector to detect a falling edge as the signal edge.

13. A system-on-chip, comprising:
a programmable logic array;
a signal conditioner coupled to the programmable logic array and including:
    an input terminal;
    a filter having an input coupled to the output of the synchronizer;
    a first multiplexer having a first input coupled to the input terminal and a second input coupled to an output of the filter;
    an edge detector having an input coupled to an output of the first multiplexer, wherein the signal conditioner is configured to receive a control signal and to selectively configured the filter, the edge detector, and the first multiplexer based on the control signal.

14. The system-on-chip of claim 13, wherein the signal conditioner includes a second multiplexer having a first input coupled to the output of the first multiplexer and a second input coupled to an output of the edge detector, wherein the signal conditioner is configured to selectively configure the first multiplexer based on the control signal.

15. The system-on-chip of claim 14, wherein the programmable logic array has a data input coupled to an output of the second multiplexer.

16. The system-on-chip of claim 15, wherein the edge detector includes a clock input terminal that receives a clock signal of the programmable logic array.

17. The system-on-chip of claim 15, wherein the programmable logic array includes a plurality of programmable logic elements, wherein at least one of the programmable logic elements is coupled to the data input.

18. An integrated circuit, comprising:
a programmable logic array having a data input; and
a signal conditioner including:
    an input;
    an edge detector; and
    a first multiplexer having a first input coupled to an output of the edge detector and an output coupled to the data input of the programmable logic array, wherein the signal conditioner is configured to receive a control signal and to selectively configured the filter, the edge detector, and the first multiplexer based on the control signal.

19. The integrated circuit of claim 18, wherein the signal conditioner includes a second multiplexer having an output coupled to an input of the edge detector and to a second input of the first multiplexer.

20. The integrated circuit of claim 19, wherein the signal conditioner includes a synchronizer coupled between the input of the signal conditioner and a first input of the second multiplexer.

* * * * *